United States Patent
Pfeuffer (10) Patent No.: US 9,806,225 B2
(45) Date of Patent: Oct. 31, 2017

(54) METHOD OF PRODUCING AN OPTOELECTRONIC SEMICONDUCTOR CHIP AND AN OPTOELECTRONIC SEMICONDUCTOR CHIP

(71) Applicant: OSRAM Opto Semiconductors GmbH, Regensburg (DE)

(72) Inventor: Alexander Pfeuffer, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/309,260

(22) PCT Filed: May 19, 2015

(86) PCT No.: PCT/EP2015/061015
§ 371 (c)(1),
(2) Date: Nov. 7, 2016

(87) PCT Pub. No.: WO2015/177164
PCT Pub. Date: Nov. 26, 2015

(65) Prior Publication Data
US 2017/0084777 A1    Mar. 23, 2017

(30) Foreign Application Priority Data

May 20, 2014    (DE) .......................... 10 2014 107 123

(51) Int. Cl.
*H01L 33/00*    (2010.01)
*H01L 33/32*    (2010.01)
(Continued)

(52) U.S. Cl.
CPC .... *H01L 33/0079* (2013.01); *H01L 31/02005* (2013.01); *H01L 31/02327* (2013.01);
(Continued)

(58) Field of Classification Search
CPC .......... H01L 33/0079; H01L 31/02005; H01L 31/022408; H01L 31/02327;
(Continued)

(56) References Cited

U.S. PATENT DOCUMENTS

2010/0171135 A1*  7/2010  Engl .................... H01L 33/382
                                                                  257/98
2012/0138969 A1*  6/2012  Moon .................. H01L 33/382
                                                                  257/88

(Continued)

FOREIGN PATENT DOCUMENTS

DE    10 2010 009 717 A1    9/2011
DE    10 2010 025 320 A1    12/2011
(Continued)

*Primary Examiner* — Karen Kusumakar
(74) *Attorney, Agent, or Firm* — DLA Piper LLP (US)

(57) ABSTRACT

A method of producing an optoelectronic semiconductor chip includes providing a growth substrate and a semiconductor layer sequence grown on the growth substrate with a main extension plane including a p-conductive layer, an active zone and an n-conductive layer, removing the semiconductor layer sequence in regions to form at least one aperture extending through the p-conductive layer and the active zone into the n-conductive layer of the semiconductor layer sequence, depositing a protective layer on a side of the semiconductor layer sequence facing away from the growth substrate, depositing an aluminum layer containing aluminum across the entire surface on a side of the semiconductor layer sequence facing away from the growth substrate, removing the growth substrate, and forming a mesa by removing the semiconductor layer sequence at the regions of the protective layer, wherein the protective layer is subsequently freely externally accessible at least in places.

20 Claims, 3 Drawing Sheets

(51) Int. Cl.
| | |
|---|---|
| *H01L 33/38* | (2010.01) |
| *H01L 33/40* | (2010.01) |
| *H01L 31/02* | (2006.01) |
| *H01L 31/0224* | (2006.01) |
| *H01L 31/0232* | (2014.01) |
| *H01L 31/0236* | (2006.01) |
| *H01L 31/0304* | (2006.01) |
| *H01L 31/18* | (2006.01) |
| *H01L 33/22* | (2010.01) |
| *H01L 33/46* | (2010.01) |
| *H01L 33/62* | (2010.01) |
| *H01S 5/02* | (2006.01) |
| *H01S 5/028* | (2006.01) |
| *H01S 5/227* | (2006.01) |
| *H01S 5/32* | (2006.01) |
| *H01S 5/323* | (2006.01) |
| *H01L 33/44* | (2010.01) |

(52) U.S. Cl.
CPC ............ *H01L 31/02366* (2013.01); *H01L 31/022408* (2013.01); *H01L 31/03044* (2013.01); *H01L 31/1892* (2013.01); *H01L 33/22* (2013.01); *H01L 33/32* (2013.01); *H01L 33/382* (2013.01); *H01L 33/40* (2013.01); *H01L 33/405* (2013.01); *H01L 33/46* (2013.01); *H01L 33/62* (2013.01); *H01S 5/028* (2013.01); *H01S 5/0217* (2013.01); *H01S 5/2275* (2013.01); *H01S 5/3202* (2013.01); *H01S 5/32341* (2013.01); H01L 33/44 (2013.01); H01L 2933/0016 (2013.01); H01L 2933/0025 (2013.01); H01L 2933/0066 (2013.01)

(58) Field of Classification Search
CPC ......... H01L 31/02366; H01L 31/03044; H01L 31/1892; H01L 33/22; H01L 33/32; H01L 33/382; H01L 33/40; H01L 33/405; H01L 33/46; H01L 33/62
See application file for complete search history.

(56) References Cited

U.S. PATENT DOCUMENTS

| | | |
|---|---|---|
| 2013/0062657 A1 | 3/2013 | Fang et al. |
| 2015/0236209 A1 | 8/2015 | Pfeuffer |

FOREIGN PATENT DOCUMENTS

| | | |
|---|---|---|
| DE | 10 2011 016 302 A1 | 10/2012 |
| DE | 10 2012 108 879 A1 | 3/2014 |
| DE | 10 2012 217 533 A1 | 3/2014 |
| DE | 10 2012 110 775 A1 | 5/2014 |
| EP | 2 402 995 A2 | 1/2012 |
| EP | 2 408 030 A2 | 1/2012 |
| EP | 2 725 629 A2 | 4/2014 |

* cited by examiner

METHOD OF PRODUCING AN OPTOELECTRONIC SEMICONDUCTOR CHIP AND AN OPTOELECTRONIC SEMICONDUCTOR CHIP

TECHNICAL FIELD

This disclosure relates to a method of producing an optoelectronic semiconductor chip and an optoelectronic semiconductor chip.

BACKGROUND

US 2010/0171135 describes a method of producing an optoelectronic semiconductor chip as well as an optoelectronic semiconductor chip. There is nonetheless a need for a method of producing an optoelectronic semiconductor chip which is to be performed in a particularly cost-effective and efficient manner.

SUMMARY

I provide a method of producing an optoelectronic semiconductor chip including A) providing a growth substrate and a semiconductor layer sequence grown on the growth substrate with a main extension plane including a p-conductive layer, an active zone and an n-conductive layer, B) removing the semiconductor layer sequence in regions to form at least one aperture extending through the p-conductive layer and the active zone into the n-conductive layer of the semiconductor layer sequence, C) depositing a protective layer on a side of the semiconductor layer sequence facing away from the growth substrate, wherein at least one cover surface of the protective layer is configured to be connected and the protective layer encloses the at least one aperture in a frame-shaped manner, D) depositing an aluminum layer containing aluminum across the entire surface on a side of the semiconductor layer sequence facing away from the growth substrate, wherein the aluminum layer completely covers the protective layer, E) removing the growth substrate, and F) forming a mesa by removing the semiconductor layer sequence at the regions of the protective layer, wherein the protective layer is subsequently freely externally accessible at least in places.

I also provide an optoelectronic semiconductor chip including a mesa, with a semiconductor layer sequence that produces electromagnetic radiation including a p-conductive layer, an active zone and an n-conductive layer, a base area, and a radiation passage surface, a via extending through the p-conductive layer and the active zone into the n-conducting layer, a connection carrier with a connection substrate, the carrier being arranged on a side of the mesa facing away from the radiation passage surface, and an aluminum layer, formed across the entire surface, which contains aluminum and is arranged between the mesa and the connection carrier, wherein the mesa is laterally surrounded by a trench free of the material of the semiconductor layer sequence, and the via is at least partially formed by the material of the aluminum layer.

I further provide a method of producing an optoelectronic semiconductor chip including A) providing a growth substrate and a semiconductor layer sequence based upon a nitride semiconductor compound material and grown on the growth substrate with a main extension plane including a p-conductive layer, an active zone and an n-conductive layer, B) removing the semiconductor layer sequence in regions to form at least one aperture extending through the p-conductive layer and the active zone into the n-conductive layer of the semiconductor layer sequence, C) depositing an electrically conductive protective layer on a side of the semiconductor layer sequence facing away from the growth substrate, wherein at least one cover surface of the protective layer is configured to be connected and the protective layer encloses the at least one aperture in a frame-shaped manner, D) depositing an aluminum layer containing aluminum across the entire surface on a side of the semiconductor layer sequence facing away from the growth substrate, wherein the aluminum layer completely covers the protective layer, E) removing the growth substrate, and F) forming a mesa exclusively in the region of the protective layer by removing the semiconductor layer sequence by a wet-chemical etching method at the regions of the protective layer, wherein the protective layer is subsequently freely externally accessible at least in places and the protective layer is chemically sealed toward chemicals used in the wet-chemical etching method.

BRIEF DESCRIPTION OF THE DRAWINGS

FIGS. 2 to 4A-4B show examples of an optoelectronic semiconductor chip by schematic sectional illustrations.

DETAILED DESCRIPTION

I provide a method of producing an optoelectronic semiconductor chip. The optoelectronic semiconductor chip may be a light-emitting diode chip or a laser diode chip respectively provided to emit optoelectronic radiation, for example. The optoelectronic semiconductor chip may be a photo diode chip that detects electromagnetic radiation, for example.

According to at least one kind of the method, initially, a growth substrate is provided. The growth substrate may, for example, be a temporary carrier removed during the method or after completion of the method. The growth substrate may be a semiconductor body, for example, on which subsequent layers of the semiconductor chip can be deposited, e.g., epitaxial.

A semiconductor layer sequence with a p-conductive layer, an active layer and an n-conductive layer may be grown on the growth substrate. Growing the n-conductive layer is effected before growing the active zone and the p-conductive-layer, for example. Thus, the n-conductive layer is arranged in a stacking direction between the growth substrate and the p-conductive layer. A cover surface of the p-conductive layer then forms a cover surface of the semiconductor layer sequence.

The semiconductor layer sequence has a main extension plane, the sequence extending laterally within the plane. The semiconductor layer sequence has a thickness perpendicular to the main extension plane, in the stacking direction, for example, in a vertical direction. Relative to the maximum extension of the semiconductor layer sequence in a lateral direction, the thickness of the semiconductor layer sequence is small. A main plane of the semiconductor layer sequence then forms the cover surface of the semiconductor layer sequence.

The active zone is in particular provided for emission or absorption of electromagnetic radiation and is located between the p-conductive layer and the n-conductive layer in the stacking direction. The semiconductor layer sequence may comprise a nitride semiconductor compound material or be formed of a nitride semiconductor compound material.

The semiconductor layer sequence may be removed in regions on its side facing away from the growth substrate. This achieves an aperture extending through the p-conducting layer and the active zone into the n-conducting layer of the semiconductor layer sequence.

The aperture completely penetrates the p-conductive layer and the active zone. However, the n-conductive layer is not completely penetrated by the aperture. That means the aperture terminates in the n-conductive layer without completely penetrating the layer. Therefore, at least one cover surface of the p-conductive layer is no longer designed to be continuous, while at least one cover surface of the n-conductive layer is designed to be continuous after the removal in regions. The aperture allows electrical contacting the n-conductive layer.

A removal of a layer in regions or in places may respectively be effected by a photo technique. To that end, first, a photoresist is attached as a mask and, subsequently, the material to be removed is removed in places of the mask or alternatively in places where there is no mask by a wet-chemical or dry-chemical etching method.

A protective layer may be deposited on a side of the semiconductor layer sequence facing away from the growth substrate. At least one cover surface of the protective layer is designed continuously. The protective layer encloses the aperture in a frame-like manner, with the aperture remaining free of the protective layer. The protective layer can be structured in the stacking direction of one or multiple layers.

The protective layer may comprise, for example, a metal such as titanium, chrome, silver, rhodium, wolfram, nickel or a transparent conducting oxide such as ITO, for example. In particular in an active zone producing red and/or infrared light, the protective layer may further comprise gold. The layer sequence of the protective layer can, for example, be structured as follows: Ti—Ag—TiWN or ITO—Ag—TiWN. Preferably, the stated order of the materials in the stacking direction is maintained. The protective layer may be formed to be electrically-conductive.

The multi-layered design may at the same time ensure meeting of different requirements. Selecting silver, rhodium and/or gold as a middle layer of the layer sequence of the protective layer may ensure high reflectivity. Furthermore, an outer layer containing titanium, chromium, wolfram, nickel ITO and/or combinations of the materials allows an increased adhesive effect to neighboring dielectrics. A "higher reflectivity" of a layer and/or layer sequence may be provided if reflectivity of the layer and/or the layer sequence for an electromagnetic radiation emitted by the active zone is at least 80%, preferably at least 90%.

In particular, the layer sequence of the protective layer is chemically sealed toward chemicals used in a wet-chemical etching method. The protective layer may thereby seal subsequently grown layers toward an acid used. The geometric shape of the protective layer is produced by a lift-off method, for example.

An aluminum layer may be deposited across the entire surface on the side of the semiconductor layer sequence facing away from the growth substrate. Deposition may be effected by vapor-deposition of the aluminum layer, for example. In particular, the aluminum layer contains aluminum or, within the production tolerances, may consist of aluminum. "Within the production tolerances" may mean that production-related impurities may be present in the aluminum layer. In particular, the aluminum layer may be electrically-conductive. It is possible for the aluminum layer to electrically contact the n-conductive layer. To that end, the aluminum layer may at least in places be in direct contact with the aluminum layer.

Furthermore, the aluminum layer may be composed of multiple layers in the stacking direction, wherein at least one of the layers may comprise a compound of aluminum and titanium. Preferably, the aluminum layer completely covers a side of the semiconductor layer sequence facing away from the growth substrate. Furthermore, the aluminum layer completely covers a side of the protective layer facing away from the growth substrate.

In particular, deposition of the aluminum layer may be effected across the entire surface. A layer is "designed across the entire surface" if the layer at least comprises one cover surface of continuous design. In other words, a layer of a continuous designed layer does not have holes or apertures.

Preferably, the aluminum layer is directly adjacent to the protective layer. Therefore, the aluminum layer is in direct contact with the protective layer and may connect to the protective layer in an electrically-conductive manner.

The growth substrate may be removed. This means that the optoelectronic semiconductor chip is free of a growth substrate after completion of the chip. The growth substrate may be removed by etching or a laser lift-off method, for example.

A mesa may be formed. The mesa is an elevation in the form of a table mountain surrounded by a trench, being part of the optoelectronic semiconductor chip. Producing the trench and therefore forming the mesa is effected by removing the semiconductor layer sequence in regions at the regions of the protective layer. Preferably, the p-conductive layer, the n-conductive layer and the active zone are completely removed at the regions of the protective layer. Forming the mesa can in particular be effected in the region of the protective layer. In other words, it is possible that the semiconductor layer sequence is only removed in regions covered and overlaid by the protective layer, respectively.

After removal of the semiconductor layer sequence at the regions, the protective layer is freely externally accessible, at least in places. Furthermore, the mesa comprises a p-conductive layer, an active zone and an n-conductive layer. The mesa may have the shape of a truncated pyramid or a truncated cone, for example, wherein the side surfaces of the mesa can be designed steeply.

The method may comprise:
A) providing a growth substrate and a semiconductor layer sequence grown on the growth substrate with a main extension plane comprising a p-conductive layer, an active zone and an n-conductive layer,
B) removing the semiconductor layer sequence in regions to form at least one aperture extending through the p-conductive layer and the active zone into the n-conductive layer of the semiconductor layer sequence,
C) deposition of a protective layer on a side of the semiconductor layer sequence facing away from the growth substrate, wherein at least one cover surface of the protective layer is configured to simply connect and the protective layer encloses the at least one aperture in a frame-like manner,
D) deposition of an aluminum layer containing aluminum across the entire surface on a side of the semiconductor layer sequence facing away from the growth substrate, wherein the aluminum layer completely covers the protective layer;

E) removing the growth substrate, and

F) forming a mesa by removing the semiconductor layer sequence at the regions of the protective layer, wherein the protective layer is subsequently freely externally accessible, at least in places.

The method steps are preferably performed in the indicated order.

In the method described, the idea is to produce an optoelectronic semiconductor chip, which provides a highly-reflective aluminum layer across the entire surface as an n-contact layer. Such a layer particularly provides the advantage that the operating voltage of the semiconductor chip is reduced due to smaller ohmic losses and due to the fact that the n-contacting region has a high reflectivity. Values of an operating voltage of less than 3 V along with an operating current of approximately 350 mA can be achieved for an optoelectronic semiconductor chip emitting blue light with a radiation decoupling surface of 1 mm$^2$.

Furthermore, a high aging resistance of the optoelectronic semiconductor chip can be expected when using an aluminum layer. In contrast to a semiconductor chip in which tin oxide and/or silver is used instead of aluminum as n-contacting layer, aluminum has a higher aging resistance and does not strongly tarnish upon oxidation, compared to silver. It is also possible in the method described herein to use one photo technique less and one metallization layer less than in a production method of the semiconductor chip not comprising an aluminum layer. Furthermore, an adhesion between aluminum and a dielectric is relatively strong compared to silver which is also suitable as an n-contacting material.

The semiconductor layer sequence may be based upon a nitride semiconductor compound material. The semiconductor layer sequence may in particular be GaN-based.

"Based upon nitride compound semiconductors" means that the active epitaxial layer sequence or at least a layer thereof comprises a nitride-III/V semiconductor compound material, preferably a $Al_nGa_mIn_{1-n-m}N$, with $0 \le n \le 1$, $0 \le m \le 1$ and $n+m \le 1$. This material does not necessarily have a composition according to the exact formula stated above. It may rather comprise one or more dopants as well as additional components, essentially not changing the physical properties of the $Al_nGa_mIn_{1-n-m}N$ material. For reasons of simplicity, the above formula merely contains essential components of the crystal lattice (Al, Ga, In, N) even if the components can in part be replaced by small amounts of further substances.

Forming the mesa in step F) may be effected by a wet-chemical etching method. Preferably, hot phosphorous acid is used to that end. However, it is as possible to use hot potassium lye for the wet-chemical etching method.

In particular, such a wet-chemical etching method comes with the advantage that, compared to a dry-chemical etching process conventionally used in nitride semiconductor compound materials, it is cheaper in use, results in a higher accuracy of the etched structures and the resulting component may have a better low-current characteristic, for example.

When using wet chemicals suitable for etching a nitride semiconductor compound material, in particular GaN, such as hot phosphorous acid, for example, there is the problem that aluminum is also etched by the wet chemicals. In fact, hot phosphorous acid is stopped by dielectrics attached as additional protective layers, but the phosphorous acid could penetrate the material of the aluminum layer through defects remaining in the dielectrics.

To protect the aluminum layer against the used wet chemicals, a protective layer is provided, the layer sealing against the hot phosphorous acid. To improve the seal, the protective layer may be composed of multiple layers in the stacking direction. The protective layer particularly allows using a wet-chemical etching method of producing the mesa.

According to one form of the method, the protective layer is formed of a material etched by the used wet chemicals with an etching rate lower than the etching rate for the nitride semiconductor compound material by at least a factor 100, preferably a factor 1,000, particularly preferably a factor 10,000. Thus, the protective layer is not or hardly etched by the hot phosphorus acid and/or hot potassium dye. In particular, etching can thus be stopped prior to the occurrence of material changes or material removals on the protective layer.

Deposition of a protective layer in step D) may be effected by a deposition method which conformably over-molds or over-covers. In particular, corners and/or edges of previously-grown layers are conformably over-covered by the protective layer during deposition of the protective layer. Sputtering or vapor deposition by a planetary transmission are suitable for such a conformably deposition. In contrast to the conventionally-used vapor deposition where there is no conform overmolding of edges or corners, a complete or conform overmolding of corners and/or edges can thus be achieved, respectively. Steep edges, grain boundaries on the edges and/or corners and/or an incomplete overmolding of the previously grown layers can thus be avoided.

Prior to production of the aperture in step B), a mirror layer may be deposited on a cover surface of the semiconductor layer sequence facing away from the growth substrate. Deposition may be effected by vapor deposition, for example. The mirror layer may in particular be an electrically-conductive layer, provided to contact the p-conductive layer. In particular, the mirror layer may be in direct contact with the p-conductive layer.

In a plan view from above, the mirror layer is designed to be continuous. A "plan view from above" is given by a plan view from a direction running perpendicular to the main extension plane, i.e., from the stacking direction. The mirror layer is in particular designed to be reflective for electromagnetic radiation produced by the active zone. The mirror layer may comprise silver, gold, aluminum, rhodium and/or platinum, for example. The cover surface of the semiconductor layer sequence remains free from the mirror layer at least in places in particular in the regions in which formation of the apertures in step B) is provided. A phototechnique may be used to that end, for example.

Before producing the aperture in step B) and after deposition of the mirror layer, a contact layer may be deposited on a side of the mirror layer facing away from the semiconductor layer sequence. Deposition of the contact layer is effected by vapor deposition, for example. The contact layer connects to the mirror layer in an electrically-conductive manner. The contact layer covers the mirror layer at least in places. However, it is also possible that the contact layer does almost completely cover the mirror layer. The contact layer may cover 90% of the cover surface of the mirror layer, for example. The contact layer may be formed with gold and/or platinum, for example.

The contact layer is directly adjacent the cover surface of the semiconductor layer sequence in regions. In other words, at least one contact surface of the contact layer facing the semiconductor layer sequence is located in one plane with the cover surface of the semiconductor layer sequence.

After producing the aperture in step B) and prior to the deposition of the aluminum layer in step C), a first passivation layer may be deposited across the entire surface on the outer surface of the mirror layer and/or the contact layer facing away from the semiconductor layer sequence. The first passivation layer is in particular designed to be electrically-conductive. The first passivation layer may consist of multiple layers in the stacking direction. However, it is also possible for the passivation layer to be exclusively composed of one single layer. The first passivation layer comprises a dielectric, electrically-insulating material such as silicon oxide, for example.

The first passivation layer may be at least partially removed in the region of the aperture. In particular, the first passivation layer is removed in the region in which the at least one aperture is adjacent to the n-conductive layer. This allows in particular external electrical contacting of the n-conductive layer. The first passivation layer in particular remains in the regions of the aperture in which the aperture is adjacent to the p-conductive layer and the active zone. This is to avoid a short circuit. The first passivation layer in particular extends into the aperture.

Regions of the aluminum layer may fill the at least one aperture after attaching the aluminum layer at least in places. Preferably, the aperture is completely filled by the aluminum layer, except for the regions in which the first passivation layer is provided. In particular, the aluminum layer electrically-conductively connects to the n-conductive layer. The regions of the aluminum layer extending into the aperture then form a via together with parts of the first passivation layer as well extending into the aperture. In other words, the aperture forms a via together with regions of the first passivation layer and regions of the aluminum layer, the via being provided to electrically contact the n-conductive layer.

Prior to removal of the growth substrate, a connection carrier may be attached on an outer surface facing away from the semiconductor layer sequence in step G). The connection carrier may comprise a solder system and a solder barrier. The solder barrier may be TiWN layers attached on the surface in a planar manner, for example.

The connection carrier is in particular provided to electrically contact the semiconductor layer sequence. The connection carrier may in particular be contacted externally. The connection carrier may be placed on another carrier and connected thereto by soldering, bonding and/or sintering, for example. To that end, the connection carrier may have contact locations on its exposed outer surface facing away from the semiconductor layer sequence, which contact locations may be soldered onto the further carrier, a printed circuit board, for example. The component resulting from the connection of the optoelectronic semiconductor chip and the further carrier may be designed to be installed as a surface-mounted device (SMD), for example.

The connection carrier may in particular be structured to be mechanically stabilizing. To that end, the connection carrier comprises a mechanically-stabilizing connection substrate. "Mechanically-stabilizing" means that the optoelectronic semiconductor chip becomes self-supporting by the connection substrate. In other words, the optoelectronic semiconductor chip may be handled with tools such as a tweezer, for example, during a production method without the need for another supporting element being provided.

A decoupling structure may be formed on an outer surface of the mesa facing away from the connection carrier in step F). The decoupling structure may be notches in the n-conductive layer. In particular, the decoupling structure serves for improved decoupling of the produced electromagnetic radiation. In other words, transmission of the electromagnetic radiation impinging the outer surface of the mesa facing away from the connection carrier is increased by the outer surface by the decoupling structure.

A second passivation layer may be deposited across the entire surface on the exposed outer surfaces of the mesa facing away from the connection carrier after forming the decoupling structure. In addition, the second passivation layer covers all exposed outer surfaces of the protective layer and/or the contact layer facing away from the connection carrier. At this stage of the production method, the optoelectronic semiconductor chip is thus electrically externally insulated on its surfaces facing away from the connection carrier. The second passivation layer is in particular formed of a dielectric and designed to be optically transparent for the radiation emitted or absorbed by the active zone. In other words, the second passivation layer is electrically-insulating. The second passivation layer can be formed with silicon dioxide, for example.

The second passivation layer may be removed in places, with the contact layer then being freely externally accessible in places. Subsequently, a contact pad is vapor-deposited onto the places. The contact pad serves for external electrical contacting of the contact layer.

Furthermore, an optoelectronic semiconductor chip is provided. Preferably, the optoelectronic semiconductor chip is produced by a method described above. That means, all features disclosed for the method are as well disclosed for the optoelectronic semiconductor chip and vice versa.

The chip may comprise a mesa. The mesa comprises a semiconductor layer sequence with a p-conductive layer, an active zone and an n-conductive layer. The active zone generates or detects electromagnetic radiation. The mesa further comprises a base area and a radiation passage surface. The radiation passage surface is in particular arranged on the side of the mesa facing away from the base area.

The optoelectronic semiconductor chip may comprise a via extending through the p-conductive layer and the active zone (all the way) into the n-conductive layer. The via comprises an electrically-conductive material, the material connecting to the n-conductive layer in an electrically-conductive way. The via penetrates the p-conductive layer and the active zone completely, while the n-conductive layer is not completely penetrated by the via.

The optoelectronic semiconductor chip may comprise a connection carrier having a connection substrate, the carrier being arranged on a side of the mesa facing away from the radiation passage surface. The optoelectronic semiconductor chip can be attached on a circuit board and electrically contacted by the connection carrier, for example.

The chip may comprise an aluminum layer containing aluminum formed across the entire surface. In particular, the aluminum layer is arranged between the mesa and the connection carrier. Preferably, the aluminum layer electrically conductively connects to the n-conductive layer. In particular, the aluminum layer reflects the electromagnetic radiation emitted or absorbed by the active zone. Reflectivity of the aluminum layer for the radiation emitted by the active zone is at least 80%, preferably at least 90%.

The aluminum layer may be directly adjacent to the n-conductive layer. However, it is as well possible that a further layer is attached across the entire surface between the n-conductive layer and the aluminum layer, the layer may be formed by a transparent conductive oxide such as ITO, for example. The further layer may have a thickness of at most 100 nm, preferably at most 50 nm. Such a further layer serves for improved electrical contacting of the n-conductive layer of the semiconductor layer sequence.

The mesa may be laterally enclosed by a trench which is free of the material of the semiconductor layer sequence. Thus, the mesa is delimited by a trench formed in a frame-like manner.

The at least one via may be at least partially formed by the material of the aluminum layer. To that end, the aluminum layer extends through the p-conductive layer and the active zone into the n-conductive layer. The material of the aluminum layer may in particular be the only electrically-conductive material of the via. The aluminum layer may in particular be the only layer of the optoelectronic semiconductor chip being provided for electric contacting of the n-conductive layer.

The aluminum layer may be formed to be simply connected in a plan view from above, i.e., in a plan view from a direction running perpendicular to the main extension plane. In a plan view from above, the base area of the mesa is completely over-covered by the aluminum layer, with the aluminum layer laterally protruding from the mesa. Thus, the aluminum layer is formed across the entire surface and has a larger expansion than the mesa along the main extension plane.

The chip may comprise a contact layer electrically conductively connected to the p-conductive layer. In particular, the contact layer is arranged laterally to the mesa in the trench at least in places, with a contact surface of the contact layer facing the semiconductor layer sequence running evenly and having a uniform surface roughness, within the production tolerance. "Surface roughness" relates to the unevenness of the surface height. The surface roughness results from the average distance of the points on the contact surface of the contact layer to a virtually-conceived mathematical plane running parallel to the main extension plane of the semiconductor layer sequence, for example.

Therefore, the contact surface of the contact layer presents no depressions and/or roughnesses surpassing the usual uniformity or irregularity, respectively, of the surface roughness of a vapor-deposited layer. Thus, the used wet-chemical etching method can be proven by the roughness. When using a dry-chemical etching method, the contact layer of the optoelectronic semiconductor component will be slightly etched, too, with an irregular surface roughness and/or irregular contact surface resulting therefrom.

The chip may comprise a second passivation layer attached to the side of the semiconductor layer sequence facing away from the connection carrier and forms an outer surface of the optoelectronic semiconductor chip. The second passivation layer encloses the mesa in a form-fit manner. The second passivation layer in particular completely encloses the trench surrounding the mesa except in regions where a contact pad is present. The second passivation layer is thus almost completely formed across the entire surface.

A cover surface of the second passivation layer facing away from the connection carrier has a constant vertical distance, i.e., a constant distance in the vertical direction to the connection substrate of the connection carrier throughout the entire region of the trench. In other words, the second passivation layer is designed planar in the region of the trench.

The wet-chemical etching method used can be proven on the planar design. The reason for thus lies with the following: as already described, the contact layer would be slightly etched, too, when using a dry-chemical etching method. In this case, the contact surface of the contact layer would no longer be located in one plane with the cover surface of the semiconductor layer sequence. As a result, a deeper trench would be formed on one side of the mesa where the contact layer is provided, than on the other side. This would then lead to a non-planar design of the second passivation layer. Thus, the cover layer of the second passivation layer would not be of a planar or even design, in the region of the trench, when using a dry-chemical etching method, respectively. Therefore, the wet-chemical etching method can be proven on the planar design of the cover surface of the second passivation layer in the region of the trench of the mesa.

All lateral surfaces of the mesa may be free of material of the contact layer. What is in particular not necessary in the method of producing such an optoelectronic semiconductor chip described above, is to remove the material of the contact layer from the lateral surfaces of the mesa. When using a dry-chemical etching method, parts of the material of the contact layer would be scattered across the lateral surfaces of the mesa due to the as well occurring etching of the contact layer. As a result, the low-current characteristic of the optoelectronic semiconductor chip could be impaired since short circuits would occur within the µA-range, for example. Due to the fact that no material traces of the contact layer are present on the lateral surfaces of the mesa, the wet-chemical etching method on the finished semiconductor chip can be proven as well.

The optoelectronic semiconductor chip may comprise a protective layer, the at least one cover surface of which is designed continuously. The protective layer encloses the mesa in a frame-like manner and is arranged between the contact layer and the aluminum layer at least in places. In particular, the protective layer is arranged in the regions of the trench of the mesa. In those places, during the production method, the aluminum layer was protected by the protective layer from the chemicals used during the wet-chemical etching process.

The chip may further comprise a mirror layer, the one cover surface of which is designed continuously. The mirror layer connects to the p-conductive layer and the contact layer in an electrically-conductive manner. In particular, the mirror layer almost completely covers the p-conductive layer. Furthermore, the mirror layer encloses the via in a frame-like manner.

The mirror layer and/or the protective layer are in particular designed to be reflective. This means that electromagnetic radiation emitted by the active zone is reflected by the mirror layer and/or the protective layer. Reflectivity of the protective layer and/or the mirror layer for the electromagnetic radiation emitted by the active zone is at least 80%, preferably at least 90%, for example.

A cover surface of the protective layer facing away from the mesa may not form an even surface and/or the protective layer may not have a uniform thickness. The "thickness" of a layer is the expansion of the layer along the stacking direction. The irregular thickness of the protective layer indicates the deposition method used for deposition of the protective layer. In the production method, the protective layer is deposited by a deposition method which conformably over-covers. In particular, the protective layer is deposited by sputtering. For the deposition by sputtering, use of a double coating system is provided. This achieves a protective layer with a non-uniform thickness. In particular, the production method of the protective layer can be proven by the irregular thickness.

The cover surface of the protective layer in at least a cross-section perpendicular to the connection carrier may comprise a shape that can be approximated by a curve that has a local maximum on each of the edges of the protective layer, with a at least one local minimum being present between the two local maxima. In particular, it is possible that the curve runs along a vertical direction. Therefore, the shape of this cross-section may correspond to a curve having horns or tips on the sides, for example. The horns or tips are formed in the regions where the mask layer was attached during deposition by the conformably-depositing deposition method. Thus, the production method of the protective layer can be proven by the shape of the protective layer.

The cover surface of the protective layer may in particular have a greater distance to the connection carrier along a lateral direction on the edges than offside the edges. The protective layer may thus have a caveated shape.

The method described herein as well as the optoelectronic semiconductor chip will hereinafter be explained in greater detail by examples and in conjunction with the figures.

Identical, like or similar elements are provided with like reference numerals throughout the figures. The figures and the size ratios of the elements illustrated in the figures are not to be considered as to be true to scale. Rather, individual elements can be illustrated in an exaggerated size for the purpose of better understanding and/or better illustration.

Figure 1A:
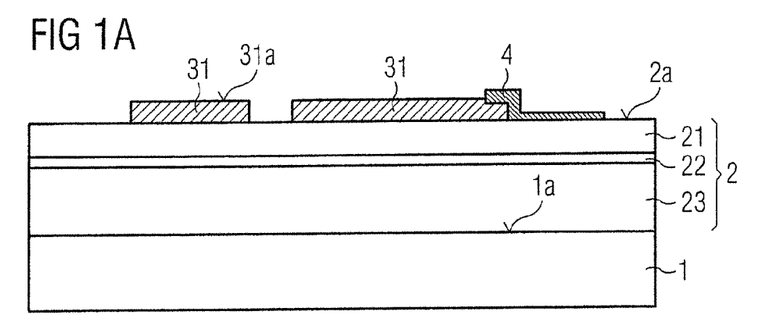
FIGS. 1A-1E show an example of a method described herein as well as an example of an optoelectronic semiconductor chip described herein by exemplary sectional illustrations.

A first method step of a method described herein of producing an optoelectronic semiconductor chip is explained in further detail by the schematic sectional illustration of FIG. 1A. In the method, first a growth substrate 1 with a cover surface 1a is provided. Then, a semiconductor layer sequence 2 with an n-conductive layer 23, an active zone 22 and a p-conductive layer 21 are arranged onto the growth substrate 1. Further, a mirror layer 31 is attached on the p-conductive layer 21, the mirror layer connected to the p-conductive layer 23 of the semiconductor layer sequence 2. A cover surface 31a of mirror layer 31 is in particular designed to be continuous. A cover surface 2a of the semiconductor layer sequence 2 remains free of the mirror layer 31, in regions. In later method steps, an aperture 70 (not shown here) is formed in the regions.

A contact layer 4 is attached on the side of the mirror layer 31 facing away from the semiconductor layer sequence 2. In particular, the contact layer 4 connects to the mirror layer 31 in an electrically-conductive manner. The contact layer 4 at least partially covers the mirror layer 31.

Figure 1B:
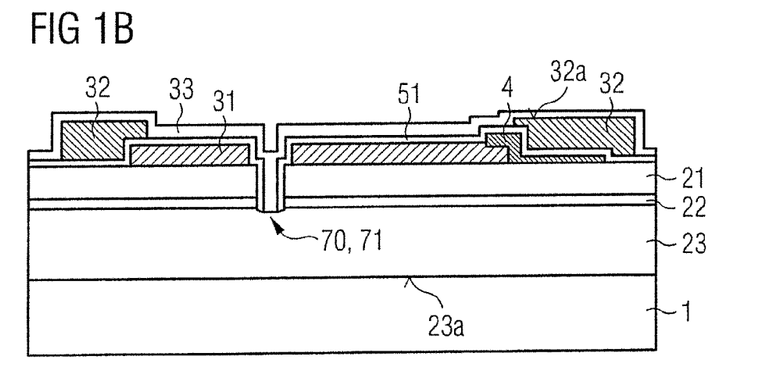

A further method step of the method described herein of producing an optoelectronic semiconductor chip is explained in more detail by the schematic sectional illustration of FIG. 1B. In this method step, the semiconductor layer sequence 2 is removed in sections, resulting in the formation of an aperture 70, extending through the p-conductive layer 21 and the active zone 22 into the n-conductive layer 23 of the semiconductor layer sequence 2.

Thus, the aperture completely penetrates through the p-conductive layer 21 and the active zone 22, with the n-conductive layer 23 only partially being penetrated by the aperture 70. In particular, a bottom surface 23a of the n-conductive layer 23 continues to be of continuous design after producing an aperture 70.

After forming the aperture 70, a first passivation layer 51 is attached and subsequently partially removed in the region of the aperture 70 so that the n-conductive layer 23 can be electrically contacted in the region of the aperture 70. The first passivation layer 51 completely over-covers the mirror layer 31 and the contact layer 4.

After attaching the first passivation layer 51, a protective layer 32 is deposited on the side of the semiconductor layer sequence 2 facing away from the growth substrate 1, with at least one cover surface 32a of the protective layer 32 is formed to be continuous. The protective layer 32 encloses the aperture 70 frame-like. The protective layer 32 is directly adjacent to the first passivation layer 51.

Now, an aluminum layer 33 is deposited on the side of the semiconductor layer sequence 2 facing away from the growth substrate 1, the aluminum layer completely over-covering the protective layer 32. In particular, the aluminum layer 33 is deposited across the entire surface. Thus, the aluminum layer 33 completely covers all previously-grown layers. In particular, the aluminum layer 33 extends into aperture 70. The aluminum layer 33 then forms a via 71 together with the first passivation layer 51, by which the n-conductive layer 23 can be electrically contacted.

Figure 1C:
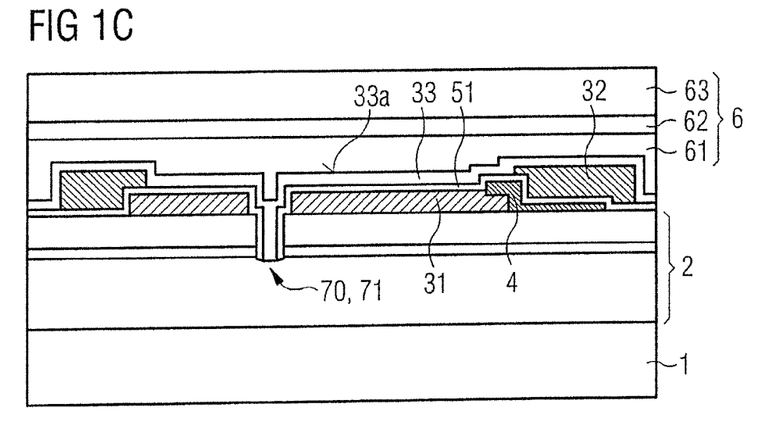

A further method step of the method of producing an optoelectronic semiconductor chip is explained in more detail by the schematic sectional illustration of FIG. 1C. After attaching semiconductor layer sequence 33, a connection carrier 6 is attached on the side of the aluminum layer 33 facing away from the growth substrate 1. The connection carrier 6 includes a solder barrier 61, a solder system 62 and a connection substrate 63. The connection substrate 63 is in particular mechanically stabilizing.

Figure 1D:
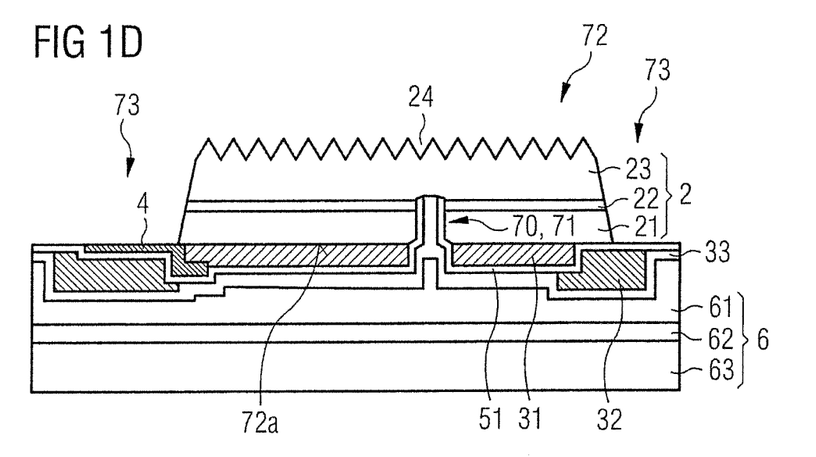

A further method step of a method described herein is explained in more detail by the schematic sectional illustration of FIG. 1D. In this method step, the growth substrate 1 has been removed.

After removing the growth substrate 1 a mesa 72 is formed. This is effected by removal of semiconductor layer sequence 2 in the regions of the protective layer 32. Preferably, removal is effected by wet-chemical etching. A trench 73 is located on the regions in which the semiconductor layer sequence 2 has been removed. The contact layer 4 and/or the first passivation layer 51 can be freely accessed externally. The mesa comprises a base area 72a located on the side of the semiconductor layer sequence 2 facing the connection carrier 6.

Furthermore, decoupling structures 24 are attached on the outer surface of the mesa 72 facing away from the connection carrier 6. To that end, the n-conductive layer 23 is at least partially removed, resulting in cut-outs 24. An outer surface 24a of the mesa facing away from the connection carrier 6 then forms a radiation exit surface of the optoelectronic semiconductor chip.

Figure 1E:
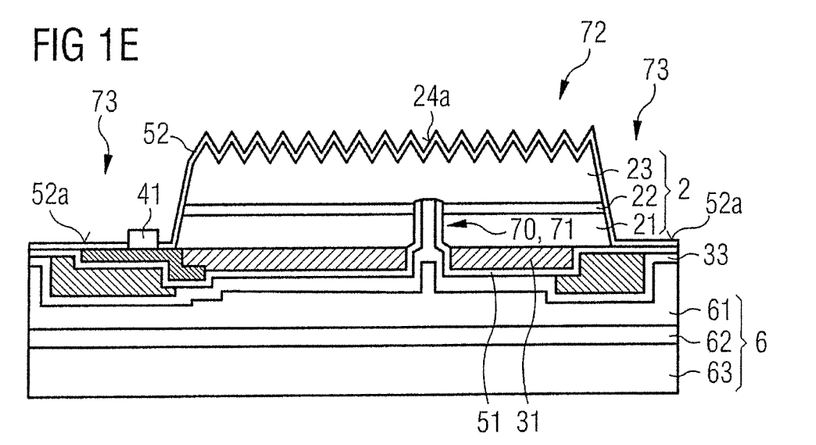

According the schematic sectional illustration of FIG. 1E, another method step of the method described herein of producing an optoelectronic semiconductor chip is explained in more detail. The method step already shows a finished optoelectronic semiconductor chip. In the method step illustrated herein, a second passivation layer 52 is attached on the exposed outer surfaces of the mesa 72 and the trench facing away from the connection carrier 6. Subsequently, the second passivation layer 52 is removed in regions. A contact pad 41 is attached on the regions in which the second passivation layer 52 has been removed. A cover surface facing away from the connection carrier 6 in the region of the trench 52a of the second passivation layer 52 has a in particular planar design. In other words, the cover surface 52a of the second passivation layer 52 has a constant distance in vertical direction to the connection substrate 63 of the connection carrier 6. The used wet-chemical etching method used to produce the mesa 72 can be proven by the planar design.

Figure 2:
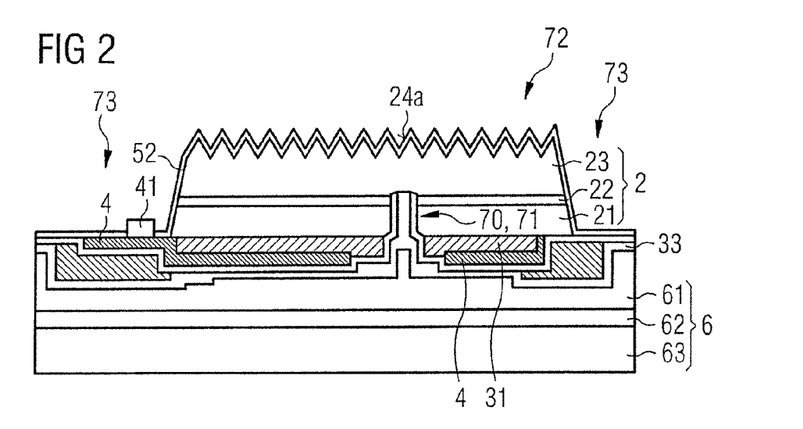

According to FIG. 2, an example of an optoelectronic semiconductor chip described herein is explained in more detail. In the example described herein, the contact layer 4 is designed such that it almost completely covers the mirror layer 31 on the cover surface of the mirror layer 31 facing away from the semiconductor layer sequence 2. The contact layer 4 covers 90% of the cover surface of the mirror layer 31, for example. The contact layer 4 furthermore has a hole in the region of the via 71.

Figure 3:
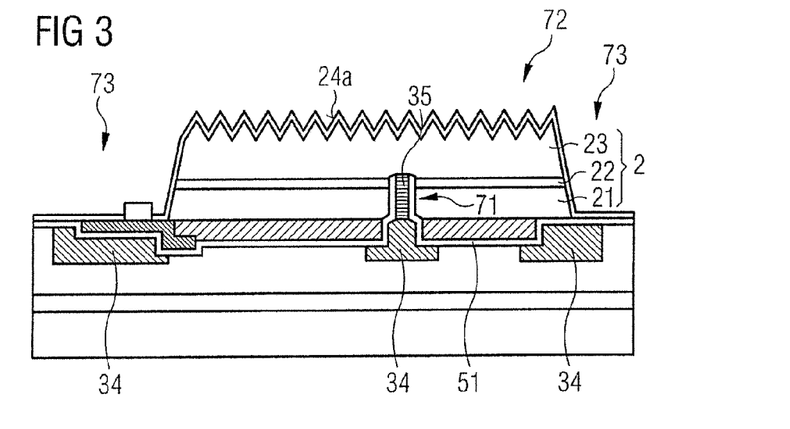

According to the schematic sectional illustration of FIG. 3, a further example of an optoelectronic semiconductor chip described herein is explained in more detail. A second mirror layer 34 is attached instead of an aluminum layer 33. Compared to the above examples, this requires a further phototechnique to produce the optoelectronic semiconductor chip according to the example of FIG. 3. The second mirror layer 34 used in this example can be formed by AgPt, for example.

Via 71 further contains an additional contact material 35, which can be formed with ZnO, for example. However, ZnO comes with the disadvantage of having a lower ageing resistance compared to aluminum, as oxidation occurs more rapid when in contact with ambient air. Furthermore, ZnO has a very low resistance against acids and bases. In addition, the second mirror layer 34 can oxidize since silver is susceptible to the permeation of humidity, thus reducing the reflectivity of second mirror layer 34.

Figure 4A:
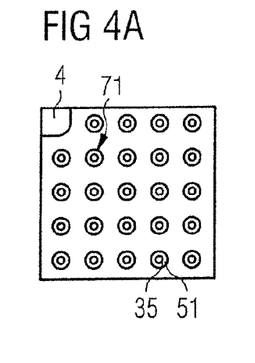
Figure 4B:
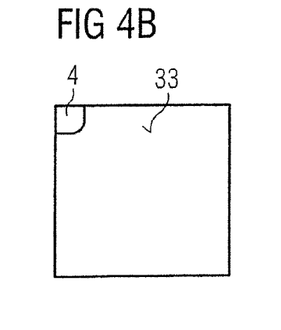

Further examples of an optoelectronic semiconductor chip described herein are described by the plan view of FIGS. 4A and 4B. The plan view takes place from above, i.e., from a direction running perpendicular to the main extension plane of the semiconductor layer sequence 2. The plan view of FIG. 4A corresponds to the sectional illustration according to FIG. 3, while the plan view of FIG. 4B corresponds to the sectional illustrations according to FIG. 1E and/or FIG. 2.

A plurality of vias 71 can be discerned from the plan view of FIG. 4a, the vias being laterally spaced from one another along the main extension plane.

There is no aluminum layer 33 formed across the entire surface in the example of FIG. 4A. Vias 71 of the example of FIG. 4A are formed with ZnO, for example. The material poorly reflects the radiation emitted by the active zone, which is why the vias 71 appear to be darker than the regions surrounding the vias 71. First, this leads to non-esthetic radiation characteristics of the optoelectronic semiconductor chip. The poor reflectivity also strongly impairs efficiency of such an optoelectronic semiconductor chip without an aluminum layer 33 formed across the entire surface. Therefore, considerably less light is decoupled in an optoelectronic semiconductor chip with a ZnO contact than in an optoelectronic semiconductor chip having an aluminum layer 33 formed across the entire surface.

In contrast, an aluminum layer 33 formed across the entire surface is present in the plan view of FIG. 4B. As a result, vias 71 can no longer be discerned in the plan view. Accordingly, the electromagnetic radiation emitted by the active zone appears to be spatially more homogenous, resulting in an esthetic radiation characteristic. The example of FIG. 4B also has a higher efficiency, as compared to ZnO, more light can be decoupled from the active zone 22 due to the higher reflectivity of the aluminum layer 33.

This application claims priority of DE 10 2014 107 123.9, the subject matter of which is incorporated herein by reference.

My methods and chips are not limited by the description by the examples. This disclosure rather comprises any new feature as well as any combination of features, which in particular includes any combination of features in the appended claims, even if the feature or combination per se is not explicitly indicated in the claims or the examples.

The invention claimed is:

1. A method of producing an optoelectronic semiconductor chip comprising:
    A) providing a growth substrate and a semiconductor layer sequence grown on said growth substrate with a main extension plane comprising a p-conductive layer, an active zone and an n-conductive layer;
    B) removing the semiconductor layer sequence in regions to form at least one aperture extending through the p-conductive layer and the active zone into the n-conductive layer of the semiconductor layer sequence;
    C) depositing a protective layer on a side of the semiconductor layer sequence facing away from the growth substrate, wherein at least one cover surface of the protective layer is configured to be contiguous and the protective layer encloses the at least one aperture in a frame-shaped manner;
    D) depositing a contiguous aluminum layer without holes containing aluminum on a side of the semiconductor layer sequence facing away from the growth substrate, wherein the aluminum layer completely covers the protective layer;
    E) removing the growth substrate; and
    F) forming a mesa by removing the semiconductor layer sequence at the regions of the protective layer by a wet-chemical etching method, wherein the protective layer is chemically sealed toward chemicals used in said wet chemical etching method, and the protective layer protects the aluminum layer against the used wet chemicals.

2. The method according to claim 1, wherein the semiconductor layer sequence is based upon a nitride semiconductor compound material.

3. The method according to claim 2, wherein the semiconductor layer sequence is based upon GaN.

4. The method according to claim 2, wherein the protective layer is formed of a material etched by used wet chemistry with an etching rate lower than an etching rate for the nitride semiconductor compound material at least by a factor 100.

5. The method according to claim 1, wherein deposition of the protective layer in C) is effected by a deposition method such that edges and corners of previously-grown layers are covered by the protective layer conformably.

6. The method according to claim 1, further comprising, before producing the aperture in B):
    depositing a mirror layer on a cover surface of the semiconductor layer sequence facing away from the growth substrate; and
    depositing a contact layer on a side of the mirror layer facing away from the semiconductor layer sequence, wherein
    the mirror layer connects to the p-conductive layer of the semiconductor layer sequence in an electrically-conductive manner,
    the mirror layer is designed continuously in a plan view from a direction running perpendicular to the main extension plane,
    the surface of the semiconductor layer sequence is free of the mirror layer at least in places,
    the contact layer electrically conductively connects to the mirror layer, and
    the contact layer covers the mirror layer at least in places.

7. The method according to claim 1, further comprising, after producing the aperture in B) and prior to the deposition of the aluminum layer in C):

depositing, across the entire surface, a first passivation layer on an outer surface of the mirror layer and/or the contact layer facing away from the semiconductor layer sequence; and at least partially removing the first passivation layer in the region of the aperture.

8. The method according to claim 1,
wherein, after D), regions of the aluminum layer at least partially fill the at least one aperture, and
the aluminum layer connects to the n-conductive layer in an electrically conductive manner so that said regions form a via together with parts of the first passivation layer, which extend into the aperture.

9. The method according to claim 1, wherein, prior to removal of the growth substrate in E) a connection carrier is attached on an outer surface facing away from the semiconductor layer sequence, and further comprising, after forming the mesa in F):

forming a decoupling structure on an outer surface of the mesa facing away from the connection carrier;
depositing a contiguous second passivation layer without holes on all exposed outer surfaces of the mesa, the protective layer and/or the contact layer facing away from the connection carrier;
removing the second passivation layer in places; and
vapor depositing a contact pad in places where the contact layer is free of the second passivation layer.

10. An optoelectronic semiconductor chip comprising:
a mesa, with
a semiconductor layer sequence that produces electromagnetic radiation comprising a p-conductive layer, an active zone and an n-conductive layer,
a base area, and
a radiation passage surface,
a via extending through the p-conductive layer and the active zone into the n-conducting layer,
a connection carrier with a connection substrate, said carrier being arranged on a side of the mesa facing away from the radiation passage surface,
a contact layer electrically conductively connected to the p-conductive layer,
a reflective electrically conductive protective layer,
an electrically isolating first passivation layer arranged between the protective layer and the contact layer and extending into the via, and
a contiguous aluminum layer without holes, which contains aluminum and is arranged between the protective layer and the connection carrier,
wherein
the mesa is laterally surrounded by a trench free of the material of the semiconductor layer sequence,
the via is at least partially formed by the material of the aluminum layer such that the aluminum layer electrically conductively connects to the n-conductive layer,
the protective layer extends from the region of the mesa to the region of the trench such that the protective layer at least partially covers the aluminum layer in the region of the trench.

11. The optoelectronic semiconductor chip according to claim 10, wherein the aluminum layer is designed electrically conductive.

12. The optoelectronic semiconductor chip according to claim 10, wherein the aluminum layer in a plan view from the direction running perpendicular to the main extension plane is configured to be connected, completely covers the base area of the mesa and laterally protrudes from the mesa.

13. The optoelectronic semiconductor chip according to claim 10, wherein the contact layer is arranged laterally to the mesa in the region of the trench at least in places, and a contact surface of the contact layer facing the semiconductor layer sequence runs even and has a uniform surface roughness.

14. The optoelectronic semiconductor chip according to claim 10, wherein a second passivation layer is provided, which forms an outer surface of the optoelectronic semiconductor chip, wherein
the second passivation layer encloses the mesa in a form-fit manner, and
the second passivation layer completely covers the trench, except in regions where a contact path is provided.

15. The optoelectronic semiconductor chip according to claim 10, wherein all lateral surfaces of the mesa are free of the material of the contact layer.

16. The optoelectronic semiconductor chip according to claim 10, wherein a reflective mirror layer is present,
in plan view the protective layer
encloses the mesa in a frame-shaped manner and
is arranged between the contact layer and the aluminum layer at least in places, the mirror layer
electrically conductively connects to the p-conductive layer and the contact layer,
almost completely covers the p-conductive layer of the mesa, and
encloses the via in a frame-shaped manner.

17. The optoelectronic semiconductor chip according to claim 16, wherein the protective layer covers corners and edges of the mirror layer conformably.

18. The optoelectronic semiconductor chip according to claim 10, wherein a cover surface of the protective layer facing away from the mesa does not form an even surface and/or the protective layer does not have a uniform thickness.

19. The optoelectronic semiconductor chip according to claim 10, wherein
a protective layer designed to be reflective is present,
the protective layer encloses the mesa in a frame-shaped manner,
the protective layer is electrically conductive,
the mesa is exclusively present in the region of the protective layer, and
the semiconductor layer sequence is based upon a nitride semiconductor compound material.

20. A method of producing an optoelectronic semiconductor chip comprising:
A) providing a growth substrate and a semiconductor layer sequence based upon a nitride semiconductor compound material and grown on said growth substrate with a main extension plane comprising a p-conductive layer, an active zone and an n-conductive layer;
B) removing the semiconductor layer sequence in regions to form at least one aperture extending through the p-conductive layer and the active zone into the n-conductive layer of the semiconductor layer sequence;
C) depositing an electrically conductive protective layer on a side of the semiconductor layer sequence facing away from the growth substrate, wherein at least one surface of the protective layer is configured to be contiguous and the protective layer encloses the at least one aperture in a frame-shaped manner;
D) depositing a contiguous aluminum layer without holes containing aluminum on a side of the semiconductor layer sequence facing away from the growth substrate, wherein the aluminum layer completely covers the protective layer;

E) removing the growth substrate; and

F) forming a mesa by removing the semiconductor layer sequence by a wet-chemical etching method only in the regions covered by the protective layer, wherein before producing the aperture in step B) a mirror layer is deposited on the semiconductor layer sequence on a side facing away from the growth substrate and a contact layer is deposited on a side of the mirror layer facing away from the semiconductor layer sequence, after producing the aperture in B) and prior to deposition of the protective layer in C) a first passivation layer is deposited on an outer surface of the contact layer facing away from the semiconductor layer sequence and the first passivation layer is subsequently partially removed in the region of the aperture, the protective layer is electrically conductive, hot phosphorous acid is used as an etching chemical, the protective layer is formed of a material etched by the used wet chemistry with an etching rate lower than an etching rate for the nitride semiconductor compound material at least by a factor 100 such that the protective layer is chemically sealed toward the chemicals used in said wet-chemical etching method.

* * * * *

UNITED STATES PATENT AND TRADEMARK OFFICE
CERTIFICATE OF CORRECTION

PATENT NO. : 9,806,225 B2
APPLICATION NO. : 15/309260
DATED : October 31, 2017
INVENTOR(S) : Alexander Pfeuffer It is certified that error appears in the above-identified patent and that said Letters Patent is hereby corrected as shown below:

In the Claims

At Column 14, at Line 14, delete "cover".

Signed and Sealed this
Thirtieth Day of January, 2018

Joseph Matal
*Performing the Functions and Duties of the*
*Under Secretary of Commerce for Intellectual Property and*
*Director of the United States Patent and Trademark Office*